(12) United States Patent
Wyse et al.

(10) Patent No.: US 9,667,211 B1
(45) Date of Patent: May 30, 2017

(54) VARIABLE GAIN AND SLOPE ACTIVE TOPOLOGY

(71) Applicants: Russell D. Wyse, Center Point, IA (US); Michael L. Hageman, Mount Vernon, IA (US)

(72) Inventors: Russell D. Wyse, Center Point, IA (US); Michael L. Hageman, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 14/868,276

(22) Filed: Sep. 28, 2015

(51) Int. Cl.
| | |
|---|---|
| *H03F 3/191* | (2006.01) |
| *H03G 3/00* | (2006.01) |
| *H03F 3/19* | (2006.01) |
| *H03F 3/45* | (2006.01) |

(52) U.S. Cl.
CPC .............. *H03G 3/004* (2013.01); *H03F 3/19* (2013.01); *H03F 3/4508* (2013.01); *H03F 2200/378* (2013.01)

(58) Field of Classification Search
CPC ... H03F 1/22; H03F 1/223; H03F 3/45; H03F 3/191
USPC .......................................... 330/254, 305, 311
See application file for complete search history.

(56) References Cited

U.S. PATENT DOCUMENTS

| | | | |
|---|---|---|---|
| 8,493,149 B2* | 7/2013 | Parikh ................. | H03G 1/0029 330/254 |
| 8,497,730 B1 | 7/2013 | Wyse | |
| 8,614,603 B1 | 12/2013 | Wyse et al. | |
| 8,660,514 B1 | 2/2014 | Wyse | |
| 8,963,612 B1 | 2/2015 | Wyse et al. | |
| 2008/0012643 A1* | 1/2008 | Duperray ................. | H03F 1/22 330/284 |
| 2013/0057346 A1* | 3/2013 | Riekki ................. | H03F 1/0277 330/254 |
| 2014/0185661 A1* | 7/2014 | Chang ..................... | H04L 27/01 375/232 |

\* cited by examiner

*Primary Examiner* — Steven J Mottola
(74) *Attorney, Agent, or Firm* — Donna P. Suchy; Daniel M. Barbieri

(57) ABSTRACT

A circuit includes an electrical gain element, a variable reactance element, and a controller. The electrical gain element is arranged to receive and change an amplitude of a signal over a set frequency range. The variable reactance element is connected to the electrical gain element. The controller is configured to control the variable reactance element to have a reactance such that the electrical gain element has a set gain slope as a function of signal frequency over the set frequency range.

18 Claims, 4 Drawing Sheets

VARIABLE GAIN AND SLOPE ACTIVE TOPOLOGY

BACKGROUND

The present disclosure relates generally to a circuit including a controller for controlling the gain slope of an electrical gain element of the circuit.

Circuits, such as amplifiers, for proving an electrical gain for signals having radio frequencies (RFs) are known. For example, cascode amplifiers, variable gain amplifiers, phase shifters and mixers are all known for providing an electrical gain for RF signals.

Such circuits may provide an electric gain over a broad frequency range. Such circuits operating over a broad frequency range, however, may not have a constant gain over the entire frequency range. For example, such circuits often have increased losses with increased frequency reducing the gain at higher frequencies.

SUMMARY

In one aspect, embodiments of the inventive concepts disclosed herein are directed to a circuit. The circuit includes an electrical gain element, a variable reactance element, and a controller. The electrical gain element is arranged to receive and change an amplitude of a signal over a set frequency range. The variable reactance element is connected to the electrical gain element. The controller is configured to control the variable reactance element to have a reactance such that the electrical gain element has a set gain slope as a function of signal frequency over the set frequency range.

In some embodiments, the controller is configured to control the variable reactance element via hardwiring or programming of the controller.

According to another aspect of the embodiment, the variable reactance element comprises a fixed inductance element.

According to another aspect of the embodiment, the variable reactance element comprises a variable capacitance element.

According to another aspect of the embodiment, the variable reactance element comprises a fixed capacitance element in parallel with the variable capacitance element.

According to another aspect of the embodiment, the variable reactance element is a varactor.

According to another aspect of the embodiment, the variable reactance element comprises a variable inductance element.

According to another aspect of the embodiment, the variable reactance element comprises a fixed inductance element.

According to another aspect of the embodiment, the electrical gain element comprises a cascode amplifier.

According to another aspect of the embodiment, the electrical gain element comprises a mixer circuit.

According to another aspect of the embodiment, the electrical gain element comprises a variable gain amplifier.

According to another aspect of the embodiment, the set gain slope as a function of signal frequency is substantially flat over the set frequency range.

According to another aspect of the embodiment, the set gain slope as a function of signal frequency is substantially zero over the set frequency range.

According to another aspect of the embodiment, the set frequency range is 20 GHz or greater over radio frequency (RF).

According to another aspect of the embodiment, the electrical gain element is configured to amplify or reduce the amplitude of the signal over the signal frequency range.

According to another aspect of the embodiment, the set gain slope as a function of signal frequency is positive, zero, or negative over the signal frequency range.

According to another aspect of the embodiment, the electrical gain element is configured to amplify or reduce the amplitude of the signal over the signal frequency range in a fixed manner or by dynamically adjusting the gain.

According to another aspect of the embodiment, the controller is configured to control the variable reactance element to adjust the set gain slope as a function of signal frequency over the set frequency range in a fixed manner or by dynamically adjusting the set gain slope.

In a further aspect, embodiments of the inventive concepts disclosed herein are directed to a method of controlling gain of a circuit. A variable reactance element of the circuit is controlled to have a reactance such that an electrical gain element of the circuit has a set gain slope as a function of signal frequency over a set frequency range. The electrical gain element is arranged to receive and change the amplitude of a signal over the set frequency range, and the variable reactance element is connected to the electrical gain element.

In some embodiments, the variable reactance element comprises a variable capacitance element.

DETAILED DESCRIPTION

Figure 1:
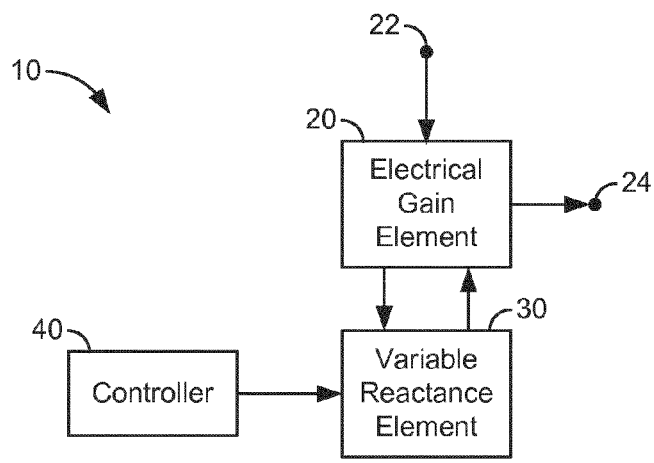
FIG. 1 is a schematic diagram of a circuit, according to an embodiment of the inventive concepts disclosed herein.

FIG. 1 is a schematic of a circuit 10, according to an embodiment of the inventive concepts disclosed herein. The circuit 10 includes an electrical gain element 20, a variable reactance element 30, and a controller 40.

The electrical gain element 20 is arranged to receive and amplify or attenuate a signal received at an input 22 of the electrical gain element 20, so as to provide an amplified or attenuated signal at an output 24 of the electrical gain element 20. The electrical gain element 20 further may perform frequency translation of the signal, if the electrical gain element 20 has a mixer function, or may perform phase manipulation. The electrical gain element may be an amplifier, phase shifter, or mixer, for example. The amplifier may be, for example, a cascode amplifier, a variable gain amplifier (VGA), or other amplifiers.

The variable reactance element 30 is connected to the electrical gain element 20 so as to provide a reactance within the electrical gain element 20. The controller 40 is configured to control the variable reactance element 30 to have a reactance such that the electrical gain element 20 has a set gain slope as a function of signal frequency over a set frequency range. The controller 40 is configured to control the variable reactance element 30 via hardwiring or programming of the controller, for example. The electrical gain element 20, variable reactance element 30, and the controller 40 may all be formed on the same chip, for example. As an alternative to the controller 40 being programmed, the electrical gain element 30 may be configured to dynamically adapt to respond to various conditioned signals to allow for a modified gain slope as a function of signal frequency over a frequency range. That is, the electrical gain element 30 may be configured to dynamically adjust gain itself.

In general, the amplitude versus frequency response in the electrical gain element 20 will depend upon the desired and undesired (parasitic) reactances of the layout and elements in electrical gain element 20, where the reactances have capacitance and inductance components. The capacitance of the electrical gain element 20 may include capacitive elements and/or parasitic capacitance. Likewise, the inductance of the electrical gain element 20 may include inductive elements and/or parasitic inductance.

The controller 40 tunes the electrical gain element 20 by controlling the variable reactance elements inside 30 to provide an appropriate reactance to the electrical gain element 20 such that the electrical gain element 20 has a set gain slope as a function of signal frequency over a set frequency range. The set frequency range will depend upon the specific application, and may be 20 GHz or greater over radio frequencies, for example.

Figure 2:
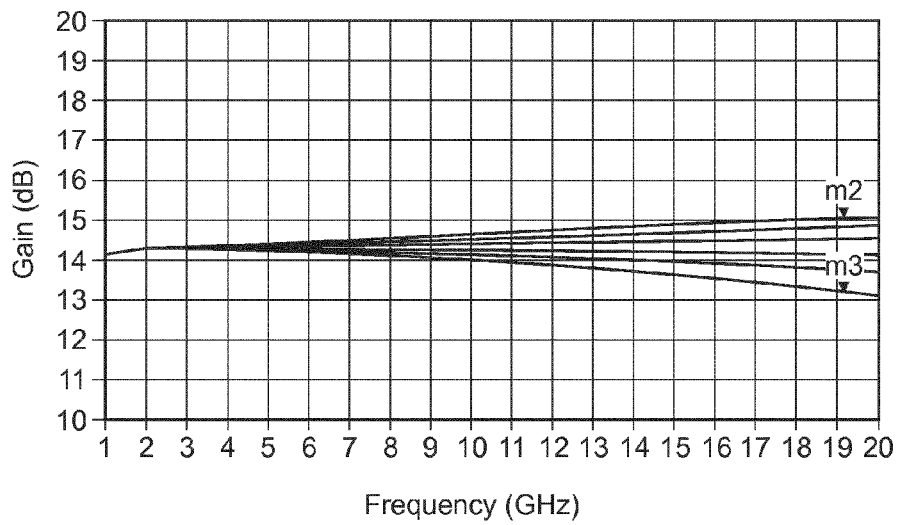
FIG. 2 is a graph illustrating gain as a function of frequency over a frequency range of 1 to 20 GHz.

FIG. 2 illustrates the gain as a function of frequency over a range of 1-20 GHz for a cascode amplifier. The different lines correspond to different reactance values applied to the electrical gain element Changing the reactance value allows the gain slope to be tuned from a positive slope, to zero slope, and then to negative slope.

As shown in FIGS. 3A-3D, the variable reactance element 30 comprises at least one of a variable capacitance element 34 or a variable inductance element 32. The variable capacitance element 34 may be a varactor, for example. Additionally, the variable reactance element 30 may comprise at least one of a fixed capacitance element 38 or a variable inductance element 36. FIGS. 3A-3D illustrate the variable reactance element 30 with various combinations of variable capacitance element 34, variable inductance element 32, fixed capacitance element 38, and fixed inductance element 36.

Figures 3A, 3B, 3C, 3D:
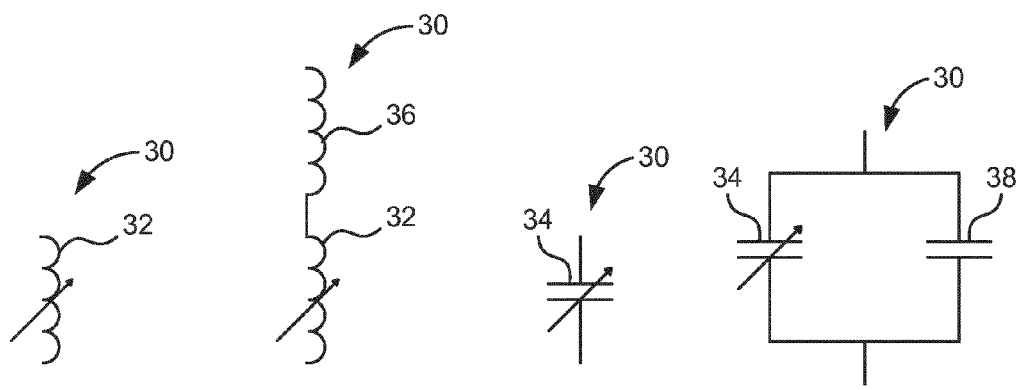
FIG. 3A illustrates a variable reactance element of the circuit of FIG. 1, with a single variable inductance element according to an embodiment of the inventive concepts disclosed herein.
FIG. 3B illustrates a variable reactance element of the circuit of FIG. 1, with a variable inductance element and a fixed inductance element according to an embodiment of the inventive concepts disclosed herein.
FIG. 3C illustrates a variable reactance element of the circuit of FIG. 1, with a single variable capacitance element according to an embodiment of the inventive concepts disclosed herein.
FIG. 3D illustrates a variable reactance element of the circuit of FIG. 1, with a variable capacitance element and a fixed capacitance element according to an embodiment of the inventive concepts disclosed herein.

FIG. 3A illustrates an arrangement of the variable reactance element 30 with only a variable inductance element 32. An example of a variable inductor is disclosed in U.S. Pat. No. 8,497,730, entitled SYSTEM AND METHOD OF MODIFYING IMPEDANCE CHARACTERISTICS OF CIRCUIT ELEMENTS, issued Jul. 30, 2013, which is incorporated by reference. FIG. 3B illustrates an arrangement of the variable reactance element 30 with a variable inductance element 32 and a fixed inductance element 36. While the variable inductance element 32 and the fixed inductance element 36 are shown connected in series in FIG. 3B, the variable inductance element 32 and the fixed inductance element 36 could also be connected in parallel.

FIG. 3C illustrates an arrangement of the variable inductance element 30 with only a variable capacitance element 34. FIG. 3D illustrates an arrangement of the variable reactance element 30 with a variable capacitance element 34 and a fixed capacitance element 38. While the variable capacitance element 34 and the fixed capacitance element 38 are shown connected in parallel in FIG. 3D, the variable capacitance element 34 and the fixed capacitance element 38 could also be connected in series.

The controller 40 is configured to control the variable reactance element 30 to vary the reactance provided by the variable reactance element 30. For example, if the variable reactance element 30 comprises a varactor, the controller applies a voltage to the varactor to change the capacitance of the varactor.

The gain slope as a function of signal frequency over the set frequency range may be set according to the application. For example, if a constant gain is desired over the set frequency range, the gain slope may be set to be substantially zero over the set frequency range.

As another more general example using electrical gain element 20 cascaded with an amplifier, if a gain with a fixed slope is desired over the set frequency range, the gain slope of electrical gain element 20 may be adjusted to create a substantially flat cascaded gain response over the set frequency range. For example, if the electrical gain element 20 is arranged in a stage prior to an amplifier which has a decreasing gain with frequency, the electrical gain element 20 may compensate for the following amplifier by having a gain response configured with an increasing gain with frequency, so the cascaded combination has a net flat gain versus frequency response.

The variable reactance element 30 provides a reactance to the circuit 10, such that the overall reactance of the electrical gain element 20 over the set frequency range of the input signal provides a set gain slope over the set frequency range. That is, the reactance provided to the electrical gain element 20 tunes the electrical gain element 20 over the set frequency range to provide a desired gain slope.

Figure 4:
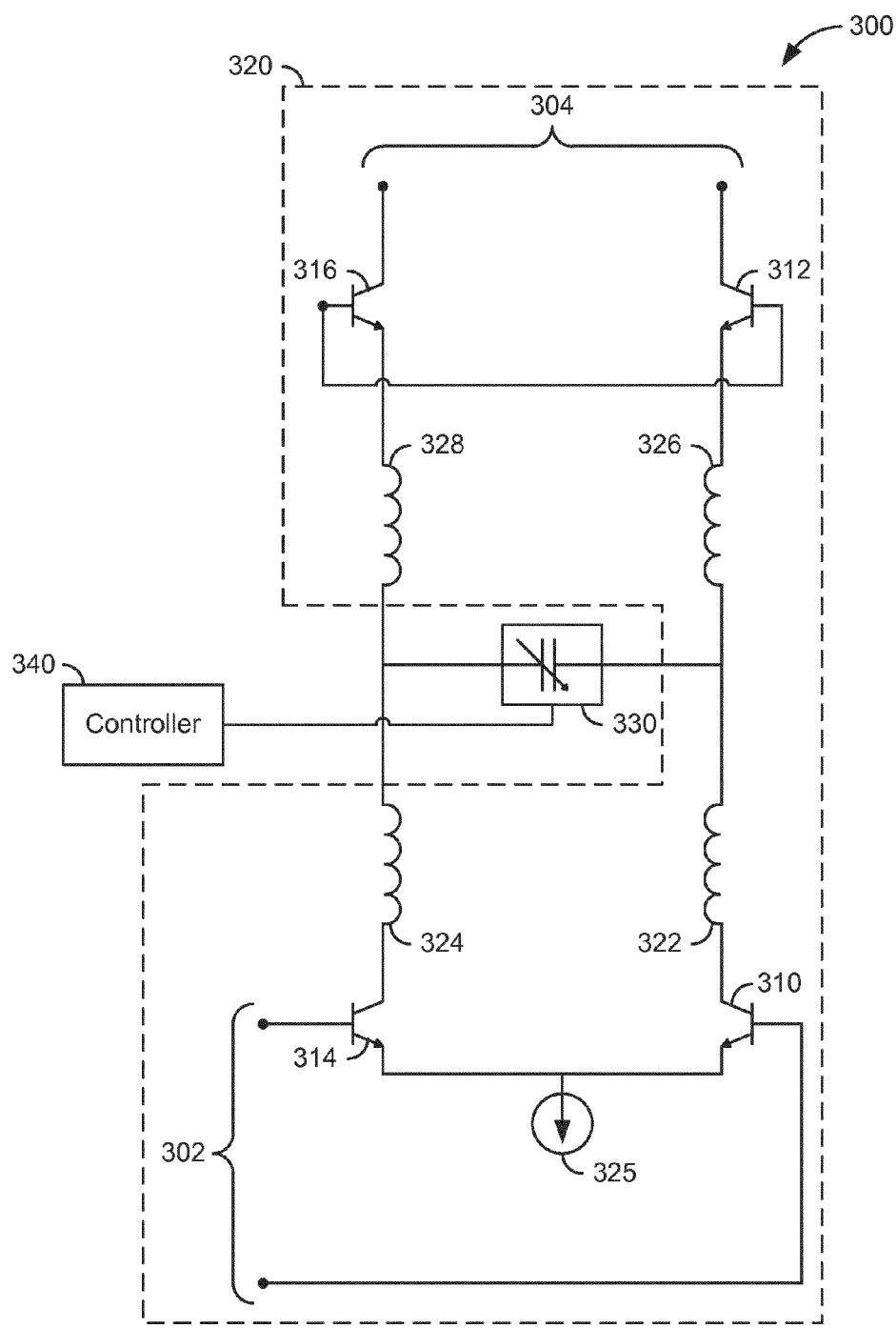
FIG. 4 is a schematic of a circuit including a cascode amplifier, according to another embodiment of the inventive concepts disclosed herein.

FIG. 4. is a circuit diagram illustrating a circuit 300 according to an embodiment of the inventive concepts disclosed herein, where the electrical gain element is a cascode amplifier in a mirrored arrangement. The circuit 300 includes an input 302 receiving a differential input signal, and an output 304 outputting an amplified differential output signal.

The circuit 300 includes a first cascode amplifier comprising bipolar transistors 310 and 312 arranged in a cascode arrangement with the emitter of the transistor 312 connected to the collector of the transistor 310. The circuit 300 further includes a second cascode amplifier comprising bipolar transistors 314 and 316 arranged in a cascode arrangement with the emitter of the transistor 316 connected to the collector of the transistor 314. The first cascode amplifier and the second cascode amplifier are connected to mirror each other. The emitters of the transistors 310 and 314 are connected to a current source 325 for this bias configuration, although various other bias configurations are possible.

The electrical gain element 320 of the circuit 300 comprises the first and second cascode amplifiers having the bipolar transistors 310, 312, 314 and 316, the input 302 and output 304, and the current source 325. The electrical gain element 320 further has inductances 322, 324, 326 and 328 as shown in FIG. 4. Depending on the specific circuit, the inductances 322, 324, 326 and 328 may be replaced with impedances in general with inductance, resistive, and capacitive elements.

The circuit 300 further includes a variable reactance element 330 and a controller 340 configured to control the variable reactance element 330. The variable reactance element may have an arrangement such as in one of FIGS. 3A-3D, for example. For example, the variable reactance element 330 may have an arrangement such as shown in FIG. 3C or 3D, where the variable reactance element 330 includes a variable capacitance element with or without a fixed capacitance element. The variable capacitance element may be a varactor, for example. Thus, with the inductances 322, 324, 326 and 328, and the variable reactance element 330 including a variable capacitance element, the circuit 300 has a series L (inductances 324 and 328) shunt C (variable capacitance element) series L (inductances 322 and 326) configuration.

The variable reactance element 330 provides a total reactance to the circuit 300, such that the overall reactance of the interface between transistors 310/312 and 314/316 over the set frequency range of the desired response creates a set gain slope over the desired frequency range. That is, the reactance provided to the electrical gain element 320 tunes the electrical amplitude versus frequency response over the set frequency range to provide a desired gain slope versus frequency. Specifically, in the case of the electrical gain element 320 with the inductances 322, 324, 326 and 328, and a variable reactance element 330 comprising a variable capacitance element, the variable capacitance element is controlled to provide a capacitance to the electrical gain element 320 which along with the inductances 322, 324, 326 and 328 tunes the electrical gain element 320 to have a desired gain slope. A general functionality of a gain slope versus frequency is shown in FIG. 2.

Figure 5:
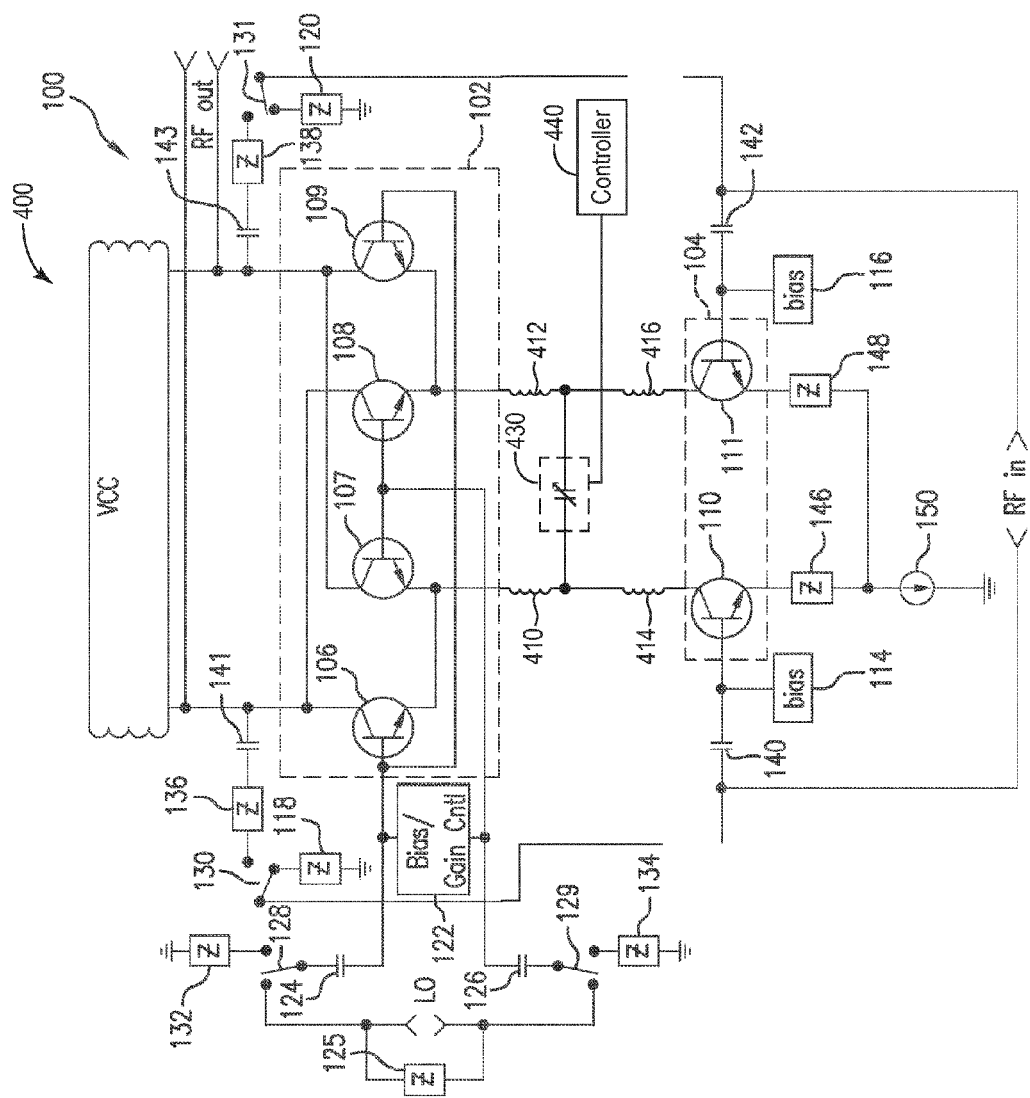
FIG. 5 is a schematic of a circuit including a multi-mode RF circuit configured as an RF mixer, according to another embodiment of the inventive concepts disclosed herein.
Figure 6:
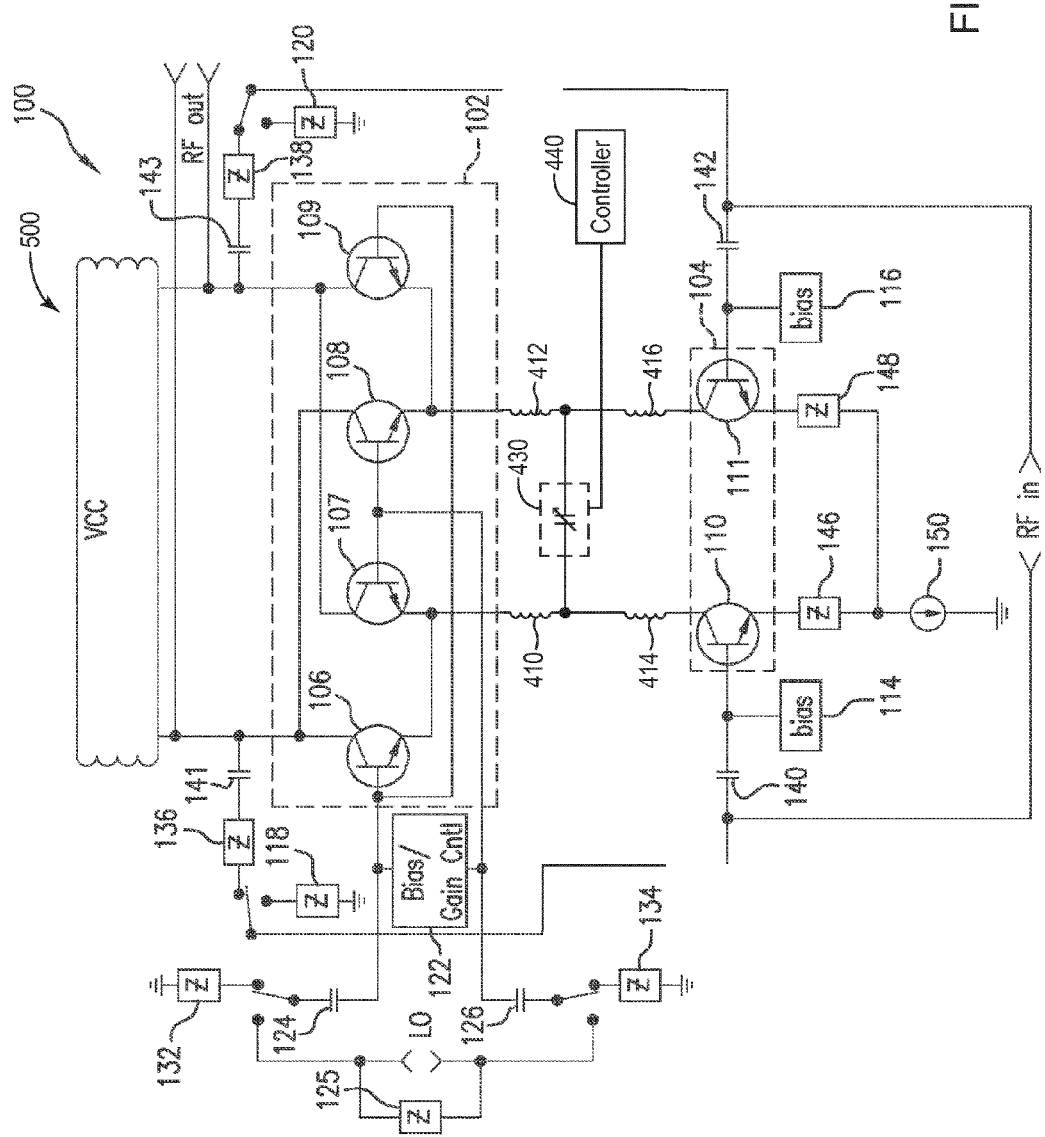
FIG. 6 is a schematic of a circuit including a multi-mode RF circuit configured as an RF amplifier, according to another embodiment of the inventive concepts disclosed herein.

FIGS. 5 and 6 show a schematic diagram of circuits 400 and 500, respectively, with a multi-mode RF circuit 100 as the electrical element, along with a variable reactance element 430 and controller 440. The multi-mode RF circuit 100 can set the average gain depending on how the bias is configured. The circuit gain slope versus frequency may be adjusted by a shunt C series L configuration, by the circuit dynamically adjusting itself, as in previous embodiments, or in mixer mode. An example of an electrical gain element configured to dynamically adjust gain itself in the case the electrical gain element is a VGA, is disclosed in U.S. Pat. No. 8,614,603, entitled AUTO LEVELING RECEIVER, issued Dec. 24, 2015, which is incorporated by reference in its entirety.

Multi-Mode RF Circuit

An example of an appropriate multi-mode RF circuit is described, for example, in U.S. Pat. No. 8,660,514 to Wyse et al., entitled MULTIPLE MODE RF CIRCUIT, which is incorporated by reference, or in U.S. Pat. No. 8,963,612 to Wyse et al., entitled MULTIPLE MODE RF CIRCUIT, which is incorporated by reference. In FIG. 5, multi-mode RF circuit 100 is configured as an RF mixer, whereas in FIG. 6, multi-mode RF circuit 100 is configured as an RF amplifier. A combination of switching and bias-shifting can move multi-mode RF circuit 100 between the mixer and amplifier modes, with or without variable gain, and across a wide range of bias and linearity.

FIG. 5 shows a quad-core transistor array 102 coupled to a differential transistor pair 104. In mixer mode, the combination of quad-core transistor array 102 and transistor pair 104 form a standard cell mixer. The mixer includes two differential amplifier stages formed by emitter-coupled transistor pairs 106, 107 and 108, 109. The collectors of a third differential transistor pair 110, 111, feed the emitter junctions of the two stages. The output currents of 110, 111 become the emitter currents for the two differential amplifier stages.

Quad-core transistor array 102 has dual pairs of heterojunction bipolar transistors (HBTs): pair 106, 107 and pair 108, 109. The emitters of each of the dual pairs 106, 107 and 108, 109 are coupled, respectively. The collectors of transistors 106 and 108 and 107 and 109 are coupled, respectively. The bases of transistors 106 and 109 and 107 and 108 are coupled, respectively. Differential transistor pair 104 has the collector of each transistor 110, 111 coupled with the emitters of transistor pairs 106, 107 and 108, 109, respectively.

A differential RF signal is applied to the bases of transistors 110, 111 of differential transistor pair 104. A pair of RF terminations 118 and 120 provides a controlled RF impedance at the RF input ports.

Bias circuits 114 and 116, each coupled to one of the differential inputs of differential transistor pair 104, hold transistors 110, 111 in the active region of operation. Bias circuits 114 and 116 along with a current source 150 allows the alteration of the transconductance, i.e., the ratio of the current change at the output port to the voltage change at the input port or $g_m$, by modifying the emitter current of differential transistor pair 104. In that regard, bias circuits 114 and 116 and current source 150, along with the bias/gain control circuit 122, can affect the total gain and dynamic range of multi-mode RF circuit 100, since an increase or decrease in the emitter current has a corresponding effect on the gain and linearity capability. The output of differential transistor pair 104 is provided to the differential input of quad-core transistor array 102 at the emitters of transistors 106, 107 and 108, 109.

A differential local oscillator (LO) signal is applied to the bases of transistor pairs 106, 109 and 107, 108. Capacitors 124 and 126, in series with the differential LO input, block the DC component of the LO signal, leaving a pure AC coupling of the LO signal. An impedance 125 in parallel with the LO input controls the input impedance for the LO signal. The LO signal provides one transistor in each pair with a higher transconductance than the other transistor for each half-cycle, thus alternating the transconductance of the transistors. The switching of the transistor pairs 106, 109 and 107, 108 mixes the LO signal with the differential RF signal received at the bases of one of the transistors in each pair 106, 107 and 108, 109 during each half-cycle to produce the differential IF or output signal at the coupled sources of transistor pairs 106, 108 and 107, 109.

A bias/gain control circuit 122 is provided across the differential LO input of quad-core transistor array 102. Bias/gain control circuit 122 holds the bias on the coupled bases of transistors 106, 109 and 107, 108 high enough to keep all the transistors in quad-core transistor array 102 operating in the active region. Bias/gain control circuit 122 provides a nominal DC voltage to ensure the quad-core transistor array 102 operates in the proper bias condition. Bias/gain control circuit 122 can also adjust the DC offset voltage between base-coupled transistor pairs 106, 109 and 107, 108. This offset voltage affects how the AC coupled LO signal impacts the transconductance of the collector-coupled transistor pairs 106, 108 and 107, 109. Increasing the offset voltage between base-coupled transistor pairs 106, 109 and 107, 108 causes current steering to occur at the collectors of collector-coupled transistor pairs 106, 108 and 107, 109 such that gain is controllable by adjusting the offset and producing a Variable Gain Mixer (VGM).

To move between mixer mode (shown in FIG. 5) and amplifier mode (shown in FIG. 6), multi-mode RF circuit 100 employs a switching network, including dual pairs of switches 128, 129 and 130, 131. Switches 128, 129 disengage the LO input from quad-core transistor array 102 and AC couples the bases of transistor pairs 106, 109 or 107, 108 to an acceptable RF termination. Switches 130, 131 create a feedback loop for gain and impedance control by disengaging the controlled RF impedance at the RF input ports provided by RF terminations 118 and 120 and coupling the bases of transistors 110 and 111 in differential transistor pair 104 to the differential RF output of quad-core transistor array 102 through corresponding impedances 136 and 138. Dual pairs of capacitors 140, 141 and 142, 143 are coupled in the feedback loop to block DC components of the RF input and the RF output.

FIG. 6 shows multi-mode RF circuit 100 in amplifier mode. Bias circuits 114 and 116 operate in the same manner as previously described. Bias/gain control circuit 122 remains connected across the differential LO input of quad-core transistor array 102. Bias/gain control circuit 122 modifies the bias in a similar manner as previously described, but this time without the LO signal being AC coupled. The bias of each of the coupled transistor pairs 106, 109 and 107, 108 are modified with respect to each other effectively steer the collector current between transistor pairs 106, 109 and 107, 108, thereby creating a variable gain amplifier (VGA).

In amplifier mode, quad-core transistor array 102 and differential transistor pair 104 are cascode-coupled in two-stage amplification. The first stage of the cascode-coupling, the input stage, includes differential transistor pair 104 with its emitter coupled to a common node through impedances 146 and 148 and current drain 150. The second stage, the output stage, includes quad-core transistor array 102 with its bases AC coupled to the common node through impedances 132 and 134. Cascode-coupling of two amplification stages advantageously provides a wide bandwidth, high gain, and better controlled input impedance.

Multi-mode RF circuit 100 can be implemented as a field programmable gate array (FPGA) allowing multi-mode RF circuit 100 to be configured as a mixer or amplifier, with variable gain and linearity settings, by the designer in the field. As such, multi-mode RF circuit 100 is a single cell that can operate as a mixer and amplifier, with or without variable gain and across a wide linearity range. Multiple multi-mode RF circuits 100 can be cascaded together to allow the designer to move the RF input signal through multiple stages, so that the system is operable in a more desirable frequency band without surrounding interference. At each stage, the designer can modify the gain and control the saturation points and linearity, which improves the spurious free dynamic range of the entire cascaded circuit for a minimum amount of DC power consumption.

Variable Reactance Element and Controller

The circuits 400 and 500 of FIGS. 5 and 6, respectively, further include a variable reactance element 430 and controller 440, where the controller 440 controls the reactance provided to the multi-mode RF circuit 100 functioning as the electrical gain element. The circuit 400 of FIG. 5 includes the multi-mode RF circuit 100, and additionally includes the variable reactance element 430 and controller 440, which are not part of the multi-mode RF circuit 100. The circuit 500 of FIG. 6 includes the multi-mode RF circuit 100, and additionally includes the variable reactance element 430 and controller 440, which are not part of the multi-mode RF circuit 100. In FIGS. 5 and 6, the multi-mode RF circuit 100 further has inductances 410 and 412 as shown.

As shown in FIGS. 5 and 6, the variable reactance element 430 may be a variable capacitive element, such as a varactor. The controller 440 is connected to, and controls, the variable reactance element 430 similar to the embodiments of FIGS. 1 and 4. The variable reactance element 430 is arranged between the quad-core transistor array 102 and the differential transistor pair 104 as shown in FIGS. 5 and 6.

The variable reactance element 430 provides a reactance to the circuits 400 and 500, such that the overall reactance of the multi-mode RF circuit 100 over the set frequency range of the input signal provides a set gain slope over the set frequency range. That is, the reactance provided to the multi-mode RF circuit 100 tunes the multi-mode RF circuit 100 over the set frequency range to provide a desired gain slope. Specifically, in the case of the multi-mode RF circuit 100 with the inductances 410 and 412, and a variable reactance element 430 comprising a variable capacitance element, the variable capacitance element is controlled to provide a capacitance to the multi-mode RF circuit 100 which along with the inductances 410 and 412 tunes the multi-mode RF circuit 100 to have a desired gain slope. Depending on the specific circuit, the inductances 410 and 412 may be replaced with impedances in general with inductance, resistive, and capacitive elements.

The embodiments of the invention have been described in detail with particular reference to preferred embodiments thereof, but it will be understood by those skilled in the art that variations and modifications can be effected within the spirit and scope of the invention.

What is claimed is:

1. A circuit comprising:
an electrical gain element arranged to receive and change an amplitude of a signal over a set frequency range of 20 GHz or greater over radio frequency (RF);
a variable reactance element connected to the electrical gain element;
a controller configured to control the variable reactance element to have a reactance such that the electrical gain element has a set gain slope, which is substantially flat as a function of signal frequency over the set frequency range.

2. The circuit of claim 1, wherein the controller is configured to control the variable reactance element via hardwiring or programming of the controller.

3. The circuit of claim 1, wherein the variable reactance element comprises a fixed inductance element.

4. The circuit of claim 1, wherein the variable reactance element comprises a variable capacitance element.

5. The circuit of claim 4, wherein the variable reactance element comprises a fixed capacitance element in parallel with the variable capacitance element.

6. The circuit of claim 4, wherein the variable reactance element is a varactor.

7. The circuit of claim 1, wherein the variable reactance element comprises a variable inductance element.

8. The circuit of claim 7, wherein the variable reactance element comprises a fixed inductance element.

9. The circuit of claim 1, wherein the electrical gain element comprises a cascode amplifier.

10. The circuit of claim 1, wherein the electrical gain element comprises a mixer circuit.

11. The circuit of claim 1, wherein the electrical gain element comprises a variable gain amplifier.

12. The circuit of claim 1, wherein the set gain slope as a function of signal frequency is substantially zero over the set frequency range.

13. The circuit of claim 1, wherein the electrical gain element is configured to amplify or reduce the amplitude of the signal over the signal frequency range.

14. The circuit of claim 1, wherein the set gain slope as a function of signal frequency is positive, zero, or negative over the signal frequency range.

15. The circuit of claim 1, wherein the electrical gain element is configured to amplify or reduce the amplitude of the signal over the signal frequency range in a fixed manner or by dynamically adjusting the gain.

16. The circuit of claim 1, wherein the controller is configured to control the variable reactance element to adjust the set gain slope as a function of signal frequency over the set frequency range in a fixed manner or by dynamically adjusting the set gain slope.

17. A method of controlling gain of a circuit, comprising:
controlling a variable reactance element of the circuit to have a reactance such that an electrical gain element of the circuit has a set gain slope, which is substantially flat as a function of signal frequency over a set frequency range of 20 GHz or greater over radio frequency (RF),
wherein the electrical gain element is arranged to receive and change the amplitude of a signal over the set frequency range, and the variable reactance element is connected to the electrical gain element.

18. The method of claim 17, wherein the variable reactance element comprises a variable capacitance element.

* * * * *